(12) United States Patent
Lojek

(10) Patent No.: US 7,301,197 B2
(45) Date of Patent: Nov. 27, 2007

(54) NON-VOLATILE NANOCRYSTAL MEMORY TRANSISTORS USING LOW VOLTAGE IMPACT IONIZATION

(75) Inventor: Bohumil Lojek, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 42 days.

(21) Appl. No.: 10/946,727

(22) Filed: Sep. 21, 2004

(65) Prior Publication Data
US 2006/0060915 A1    Mar. 23, 2006

(51) Int. Cl.
    *H01L 29/788*    (2006.01)
(52) U.S. Cl. ...................... 257/322; 257/404
(58) Field of Classification Search ............ 257/322, 257/900, 404; 365/185.01, 185.18; 438/257
    See application file for complete search history.

(56) References Cited

U.S. PATENT DOCUMENTS

| | | | |
|---|---|---|---|
| 3,868,187 A * | 2/1975 | Masuoka ............... 257/322 |
| 4,016,588 A * | 4/1977 | Ohya et al. ............ 257/322 |
| 4,432,075 A | 2/1984 | Eitan .................... 365/185 |
| 4,597,000 A * | 6/1986 | Adam .................... 257/322 |
| 4,821,236 A | 4/1989 | Hayashi et al. ........ 365/185 |
| 5,714,766 A | 2/1998 | Chen et al. ............. 257/17 |
| 5,937,295 A | 8/1999 | Chen et al. ............. 438/257 |
| 6,054,349 A | 4/2000 | Nakajima et al. ....... 438/257 |
| 6,090,666 A | 7/2000 | Ueda et al. ............. 438/257 |
| 6,125,053 A | 9/2000 | Diorio et al. .......... 365/185.03 |
| 6,300,193 B1 | 10/2001 | Forbes .................. 438/257 |
| 6,320,784 B1 | 11/2001 | Muralidhar et al. ..... 365/151 |
| 6,331,463 B1 | 12/2001 | Chen .................... 438/257 |
| 6,344,403 B1 | 2/2002 | Madhukar et al. ...... 438/503 |
| 6,351,411 B2 | 2/2002 | Forbes et al. .......... 365/182 |
| 6,574,144 B2 | 6/2003 | Forbes |
| 6,580,124 B1 * | 6/2003 | Cleeves et al. ......... 257/331 |
| 6,586,785 B2 | 7/2003 | Flagan et al. .......... 257/261 |
| 6,621,116 B2 * | 9/2003 | Church ................. 257/314 |
| 6,690,059 B1 | 2/2004 | Lojek ................... 257/316 |
| 6,912,158 B2 * | 6/2005 | Forbes ................. 365/185.18 |

* cited by examiner

*Primary Examiner*—Mark V. Prenty
(74) *Attorney, Agent, or Firm*—Schneck & Schneck; Thomas Schneck

(57) ABSTRACT

A low voltage non-volatile charge storage transistor has a nanocrystal layer for permanently storing charge until erased. A subsurface charge injector generates secondary carriers by stimulating electron-hole current flowing toward the substrate, with some carriers impacting charge in nanocrystals. The charge injector is a p-n junction diode where one polarity is source and drain electrodes and the other polarity is two split doped regions in the substrate partially overlapping the active area on opposite sides of the active area. Any misalignment of masks for making the injected doped portions is inconsequential because a misalignment on one side of the active area offsets the corresponding misalignment on the other side. The injector implanted portions with overlap in the active area always have the same total area in the active area. This leads to programming reliability.

8 Claims, 4 Drawing Sheets

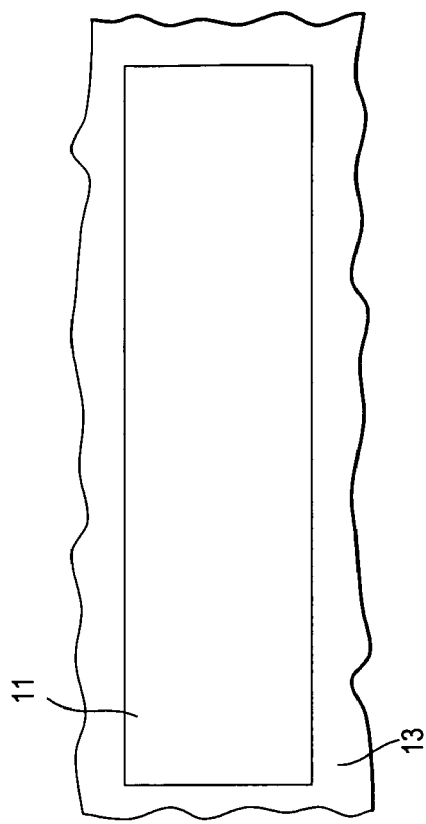
Fig._1
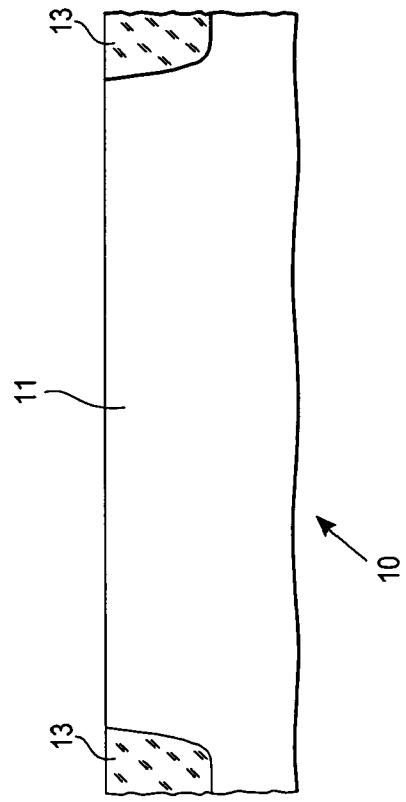
Fig._2
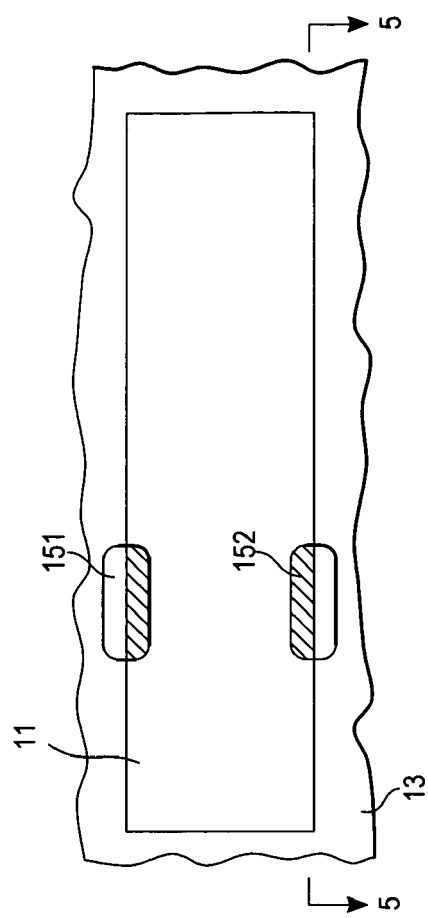
Fig._3
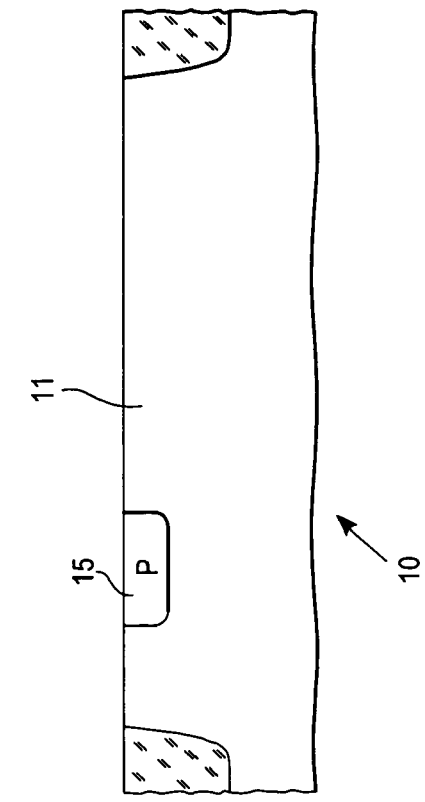
Fig._4

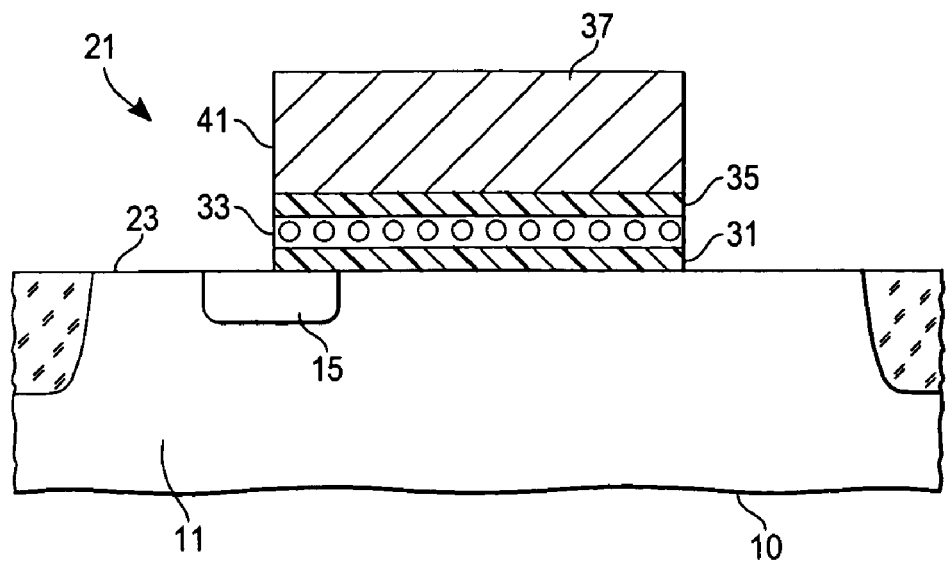
Fig._5
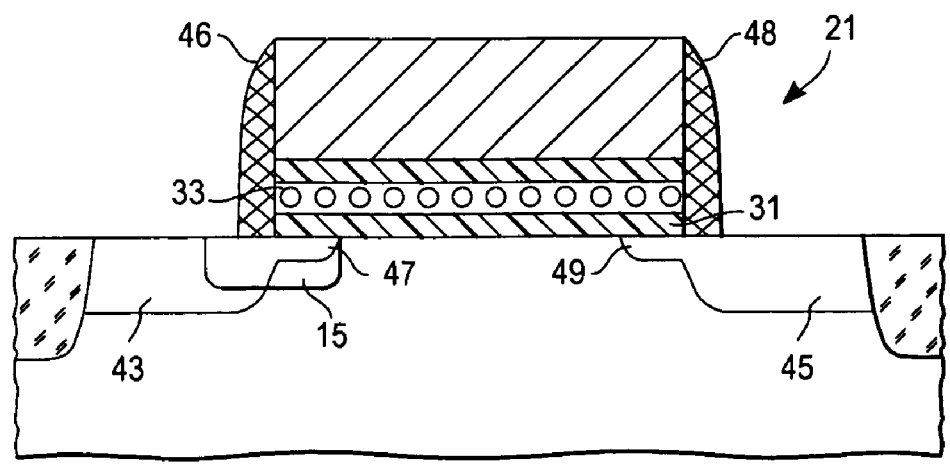
Fig._6

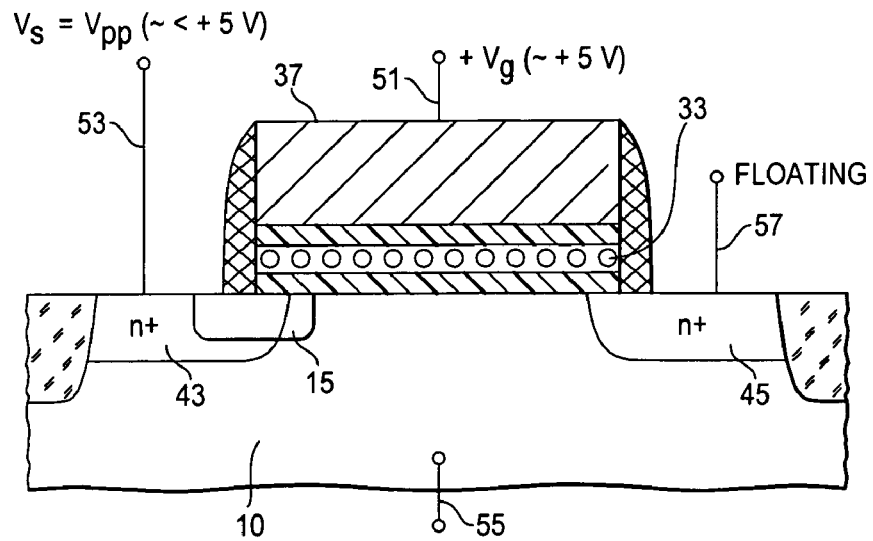
*Fig._7*
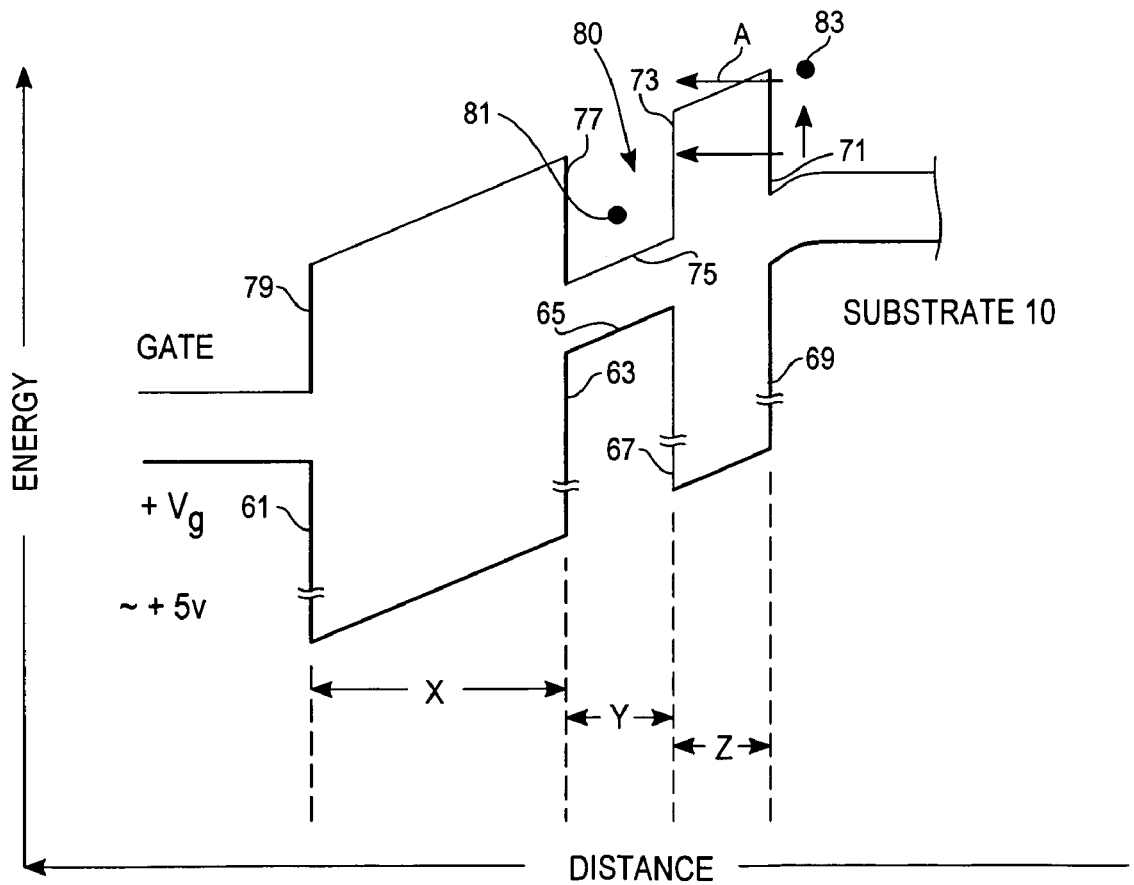
*Fig._8*

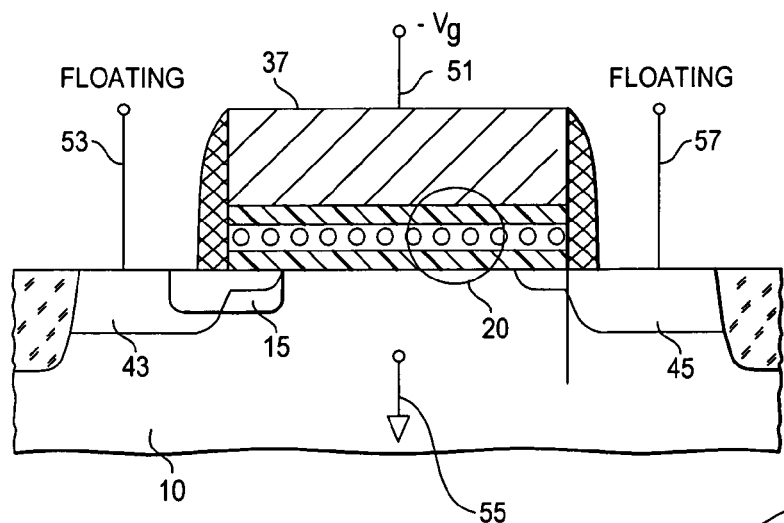
Fig._9
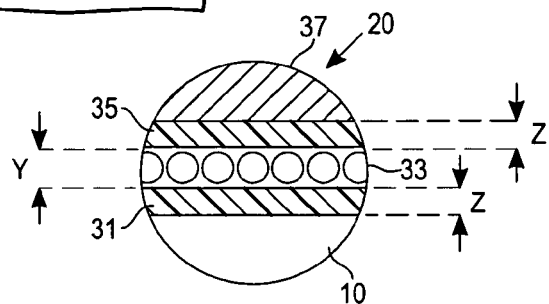
Fig._10
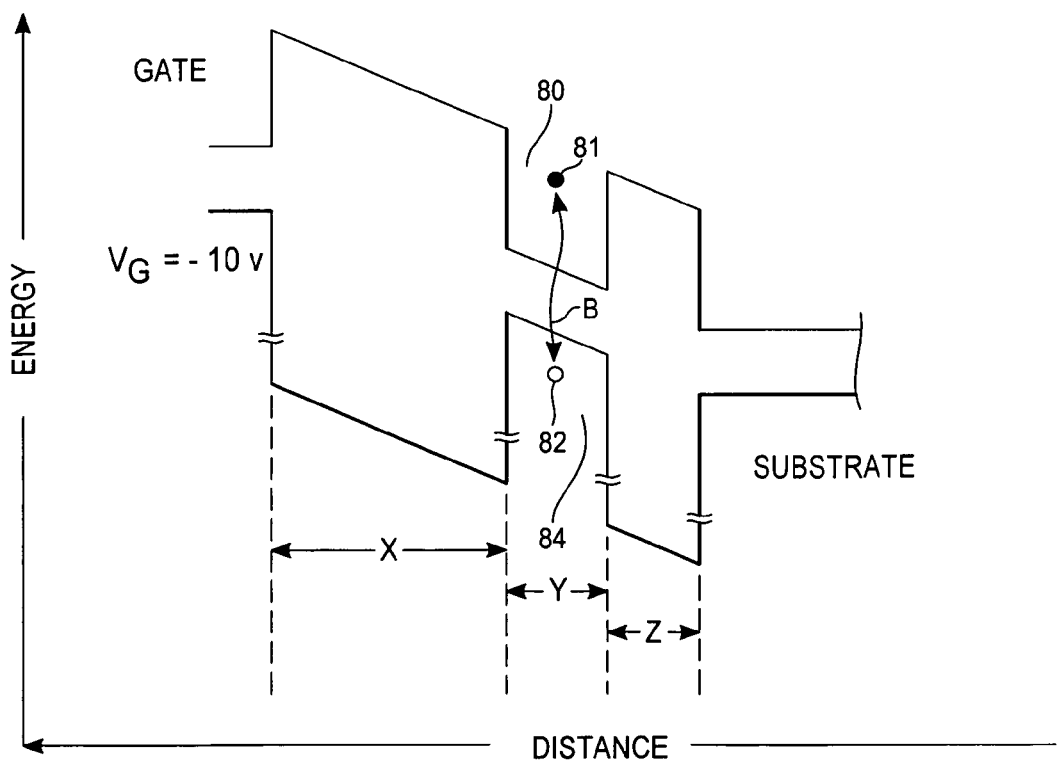
Fig._11

NON-VOLATILE NANOCRYSTAL MEMORY TRANSISTORS USING LOW VOLTAGE IMPACT IONIZATION

TECHNICAL FIELD

The invention relates to non-volatile memory transistors and, in particular, to non-volatile nanocrystal memory transistors operating at low voltage for programming and erasing.

BACKGROUND ART

Impact ionization has been known for several years. U.S. Pat. No. 4,432,075 to B. Eitan and U.S. Pat. No. 4,821,236 to Hayashi et al. describe an EEPROM transistor adjacent to a charge generator, creating a substrate current near the EEPROM, creating excess charge or holes, resembling space charge, near subsurface electrodes of the EEPROM. Assume that the holes are generated and accelerated toward one of the electrodes of the EEPROM. Resulting secondary electrons are sufficiently energetic to penetrate gate oxide over the substrate and become injected into a conductive floating gate. For very small EEPROMs, the floating gate becomes charged by band-to-band tunneling, a situation which eliminates the need for a control gate over the floating gate.

U.S. Pat. No. 6,690,059 to B. Lojek and assigned to the assignee of the present invention discloses a nanocrystal EEPROM transistor where charge is stored in a nanocrystal layer. Charge is supplied from a charge storage layer for facilitating electron communication between the two layers. Other EEPROM nanocrystal devices exist in the prior art without the charge storage layer, such as U.S. Pat. No. 6,320,784 to Muralidhar. In the '784 patent, charge is moved or removed from nanocrystal elements using traditional electrodes existing in non-nanocrystal EEPROMs.

One of the problems that occurs is that either high voltages or relatively large currents are needed for programming many nanocrystal EEPROMs. Where programming is by Fowler-Nordheim tunneling, large voltages are needed. To obtain high charge, charge pumps are frequently employed. This means additional circuitry, including switches, capacitors and an oscillator. Where programming is by hot electrons, a good current is required. This, too, requires additional circuitry. An object of the invention was to devise a nanocrystal EEPROM that could be programmed at low voltage and with low current.

SUMMARY OF THE INVENTION

The above object has been achieved in an MOS transistor by providing a tiny low voltage, low current, split charged particle injector in the substrate of a chip having a nanocrystal layer EEPROM. The injector allows for low voltage generation of charged species that cause impact ionization to supply electrons for storage on the nanocrystals. The tiny current injector is a diode split by design in two halves or portions that are spaced apart and overlay the edges of the active area of the chip. Misalignments between the two portions are mutually offset because a loss to one portion is a gain to the other portion. The overall area of the injector remains the same.

In a P-substrate, the two injector halves will be P-type material since the subsurface electrodes are typically N-type. This allows formation of P-N junctions. Alternatively, in an N-well, the halves will be N-type since subsurface electrodes would be P-type to form the P-N junctions.

BRIEF DESCRIPTION OF THE DRAWINGS

FIG. 1 is a side sectional plan view of a portion of a wafer substrate illustrating a first manufacturing step in making a nanocrystal memory transistor using impact ionization in accordance with the present invention.

FIG. 2 is a top plan view thereof.

FIG. 3 is a side sectional plan view showing a manufacturing step subsequent to the step of FIG. 1 involving placement of split injector portions in the substrate.

FIG. 4 is a top view thereof.

FIG. 5 is a side sectional plan view taken along lines 5-5 in FIG. 4, showing manufacturing steps subsequent to the step of FIG. 3 involving manufacture of a gate stack structure upon the substrate.

FIG. 6 is a side sectional plan view showing a manufacturing step further to FIG. 5.

FIG. 7 is a side sectional plan view of FIG. 6 with a programming voltage plan.

FIG. 8 is a voltage versus distance plot for the device of FIG. 7.

FIG. 9 is a side sectional plan view of FIG. 6 with an erase voltage plan.

FIG. 10 is a magnified view of circle 20 in FIG. 9 with a stylized representation of distances X, Y and Z shown in FIGS. 8 and 11.

FIG. 11 is an energy versus distance plot for the device of FIG. 9.

BEST MODE OF CARRYING OUT THE INVENTION

With reference to FIG. 1, a P-type substrate 10 is defined in a silicon wafer with an active area 11 bounded by an isolation region periphery, such as STI region 13. Alternatively, the active area 11 may be in a P-well in an N-type substrate. In the top view of FIG. 2, the active area 11 is seen to be rectangular and surrounded by the isolation region 13.

In FIG. 3, the active area 11 of the substrate 10 has been implanted with a doped P-type injector region 15. The injector region is made in two portions that may be halves and so there are two implants 151 and 152 seen in FIG. 4.

In FIG. 4, the injector halves 151 and 152 are each P-type doped regions that overlap the boundary of the active area 11 by approximately fifty percent. The regions of overlap are indicated by hatching. By making the injector regions in two halves, any misalignment in overlap with the boundary of the active area on one side of the active area will offset on the other side. Thus, mask misalignments are inconsequential insofar as the total amount of injector region being within the active area. For example, if one injector half has sixty percent of its area in the active region, the other injector half will have forty percent of its area in the active region. The injector portions or halves are positioned where they will overlap with one or the other of source and drain of a transistor device to be built in subsequent stages.

In FIG. 5, a gate stack 21 has been fabricated on the surface 23 of a semiconductor substrate in the active area 11. The stack 21 partly overlaps the P-type injector region 15. The overlap is provided such that the injector 15 will be in contact with a later fabricated source or drain in order to form a P-N junction. The stack 21 is formed by etching a plurality of overlying layers. The first or lowermost layer is an insulative tunnel oxide layer 31 having a thickness in the range of 10-50 Angstroms, followed by an overlying nanocrystal charge storage layer 33, an overlying insulative control oxide layer 35, and an overlying conductive control poly layer 37.

The nanocrystal layer 33 may be formed by any of the various methods known in the art. For example, silicon atoms may be implanted into a dielectric material. A subsequent annealing step causes the implanted silicon atoms to group together through phase separation to form the nanocrystals. Alternatively, amorphous silicon may be deposited on top of the tunnel oxide layer 31, as disclosed, followed by a subsequent annealing step to recrystallize the amorphous silicon into nanocrystals. Other techniques utilize LPCVD nucleation and growth process to form crystalline nanocrystals directly on a tunnel dielectric layer. Nanocrystals are typically from 3 nm to 6 nm (30 Å-60 Å) in diameter with a surface density of about $5(10^{12})/cm^2$ to $1.0(10^{13})/cm^2$, but other sizes and surface densities are known.

The control poly layer 37 is the first layer of polysilicon and has a thickness in the range of 1.5-2.5 kÅ. After layers 31, 33, 35, and 37 have been deposited, they are masked and etched to form stack 21.

The gate stack 21 has near vertical sidewalls, such as sidewall 41, that allows self-aligned implantation of subsurface n+ regions 43 and 45, seen in FIG. 6. In FIG. 6, after implantation of regions 43 and 45, n+ LDD regions 47 and 49 are formed as extensions of the subsurface source and drain regions 43 and 45. After formation of the n+ LDD regions 47 and 49, the sidewall spacers 46 and 48 may be established. The spacers are typically made of nitride and are formed by disposing a nitride layer over the wafer to the height of the top of the stack 21. The nitride is partially removed, leaving spacers 46 and 48 but removing the remainder of the nitride layer. The spacers prevent entry or loss of mobile ions or electrons from the charge storage layer of the stack 21.

The source and drain regions 43 and 45, together with extensions 47 and 49 are subsurface electrodes of the same n-conductivity type that interact with the charge storage layer of stack 21 by forming a channel between source and drain regions 43 and 45. One of the source and drain regions 43 and 45 forms a P-N junction with injector 15 so that a diode is formed relative to the P-substrate 10. This P-N junction, when reverse biased, generates hole and electron (e-h) current mostly flowing to the substrate. The e-h current results in space charge within the active area 11, with whole impaction on the source and drain electrodes 43 and 45. The secondary electrons generated by impact ionization are sufficiently energetic as to be available for tunneling through the tunnel oxide layer 31 to the nanocrystal layer 33. The tunneling mechanism for electrons from the substrate through the tunnel oxide to the nanocrystal layer is thought to be hot electron transfer. In other words, by activation of the P-N junction involving injector 15 by a relatively low voltage, i.e. less than 5 volts, programming of the nanocrystal layer occurs.

With reference to FIG. 7, a programming voltage, $V_g$, of approximately 5 volts is applied to the control poly member 37 by contact 51. The source 43 has a contact wire 53 where a positive voltage, less than the programming voltage, is applied. The voltage $V_s$, applied to wire 53, is somewhat less than +5 volts to establish a gradient between control poly member 37 and source region 43. At the same time, the voltage applied on line 53 is sufficient to reverse bias the P-N junction formed by the injector region 15 and the source 43. This generates e-hole current in substrate 10 which is grounded by a grounding contact 55. Some of the carriers in the substrate impact upon the source and drain electrodes 43 and 45, creating electron space charge, some of which is accelerated toward control poly electrode 37 and the contact wire 51 carrying the positive voltage $V_g$. These electrons, known as hot electrons, penetrate the tunnel oxide and some electrons become trapped in nanocrystal layer 33. The drain electrode 45 is floating. A contact wire 57 is not connected.

The electrical potential diagram of FIG. 8 is similar to the diagram of FIG. 2 in U.S. Pat. No. 4,821,236. Substrate 10 is shown to have a width dimension, S. In FIG. 8, the lower curve 61 represents positive voltage applied at the top of the mesa structure as seen by an electron in the substrate. The positive voltage $V_g$ is attenuated across the distance X representing the thickness of the control oxide. At the nanocrystal layer, the electrical potential becomes higher represented by line 63 and increases across the nanocrystal layer having a thickness Y with the increasing potential represented by line 65. Upon encountering tunnel oxide, the electrical potential again falls indicated by line 67 and is attenuated toward the substrate, the tunnel oxide thickness being indicated by the letter Z until the substrate 10 is reached whereupon the electrical potential again diminishes, indicated by line 69. An inverse voltage arrangement is experienced by holes where the highest negative voltage, indicated by line 71, is closest to the substrate. Traversing the tunnel oxide, voltage increases across the tunnel oxide or thickness dimension Z to line 73. The electrical potential increases to line 75 and then decreases to line 77 forming a potential well 80. Electrons can be trapped in nanocrystals which form due to quantum confinement in a potential well, such as electron 81. Here the electron is shown in well 80 (polarity reversal) so that the electron appears to be trapped. Electrical potential increases across the thickness of the control oxide apex to line 79.

When programming voltages are applied, as shown in FIG. 7 electrons, such as electron 83, seen in FIG. 8, overcome the potential barrier of the tunnel oxide and tunnel through the oxide as indicated by the horizontal arrows A and wind up in a potential well, similar to potential well 80 (polarity reversal), where they will remain indicating a specific memory state such as a digital 1 or a digital 0.

In the erase mode, voltages are applied as shown in FIG. 9, but the transistor structure is the same as in FIG. 7. Note that circle 20 in FIG. 9 has been magnified in FIG. 10 to illustrate distances X, Y and Z. The Y dimension is a very thin nanocrystal layer. The X dimension is above the nanocrystal layer but below the control gate and the Z dimension is below the nanocrystal layer and above the substrate. Returning to FIG. 9, wire 53 is floating and therefore carries no electrical potential to source 43. The wire 51, in contact with the control poly layer 37, is biased at a negative voltage, $-V_g$. Wire 57 is floating and so no electrical potential is transferred to drain electrode 45. The negative voltage on control poly has an influence on the transistor device, as shown in FIG. 11. Here the electron 81 is influenced by the negative gate voltage $V_g$ which may be up to −10 volts. The electron 81 may recombine with holes that tunnel through the thickness, Z, of the tunnel oxide, for example hole 82 that becomes trapped in potential well 84, also within the Y dimension. The hole 82 can recombine with electron 81, indicated by wavy line B. The charge from the nanocrystal region is reduced and channel conductance will change accordingly.

Reading of the state of the device depends upon channel conductivity. When charge is stored in the nanocrystal layer, channel conductivity is different from the situation where charge is not stored. The conductivity of the channel is ascertained by sense transistors, not described in this application.

The invention claimed is:

1. An EEPROM transistor comprising:
   a substrate of semiconductor conductivity having a grounded conductive contact in an active area bound by isolation regions,
   a gate stack structure disposed on the substrate, the gate stack structure having a nanocrystal layer disposed in an insulative manner over the substrate and an overlying control layer insulated from the nanocrystal layer,
   source and drain regions in the active area of the substrate flanking the gate stack structure, both of a first conductivity type,
   an injector region having two spaced apart portions in the active area of the substrate of a second conductivity type, both injector portions in contact with one of the source and drain regions, the two portions of the injector region overlapping the active area at spaced apart locations, thereby forming a p-n junction in the substrate, and
   reversible bias means not exceeding five volts associated with the p-n junction for causing charge carriers of a first polarity to flow into the grounded conductive contact of the substrate causing space charge in the substrate with charge carriers of a second polarity impacting upon the source and drain regions thereby causing hot electrons to become trapped in the nanocrystal layer thereby programming the nanocrystal layer with bias in one voltage polarity and electrically erasing the nanocrystal layer with bias in another voltage polarity.

2. The EEPROM transistor of claim 1 wherein said bias means comprises a first low voltage source not exceeding five volts in contact with one of the source or drain regions in P-N communication with the injector region and a second low voltage source not exceeding five volts in contact with the control layer.

3. The EEPROM transistor of claim 2 wherein the other of the source or drain not in contact with the first low voltage source is electrically floating.

4. The EEPROM transistor of claim 1 wherein the conductive contact of the substrate is electrical ground.

5. The EEPROM transistor of claim 1 wherein the gate stack structure at least partially overlies the injector region.

6. The EEPROM transistor of claim 1 wherein the source and drain regions are self-aligned with the gate stack structure.

7. The EEPROM transistor of claim 1 wherein the substrate is P-type semiconductor material, the injector region is P-type semiconductor material and the source and drain regions are N-type semiconductor material.

8. The EEPROM transistor of claim 1 wherein the gate stack structure has vertical sidewalls with insulative spacers capping the sidewalls.

* * * * *